United States Patent [19]
Smith et al.

[11] Patent Number: 5,260,653
[45] Date of Patent: Nov. 9, 1993

[54] THIN FILM VERY HIGH SENSITIVITY MAGNETORESISTIVE MAGNETOMETER HAVING TEMPERATURE COMPENSATION AND SIMPLE DOMAIN STABILITY

[75] Inventors: Neil Smith, San Diego; Jay D. Freeman, Leucadia; Frederick J. Jeffers, Escondido, all of Calif.

[73] Assignee: Eastman Kodak Company, Rochester, N.Y.

[21] Appl. No.: 892,872

[22] Filed: Jun. 3, 1992

[51] Int. Cl.$^5$ .............................. G01R 33/06
[52] U.S. Cl. ..................... 324/252; 324/225; 338/32 R
[58] Field of Search .......... 324/225, 251, 252, 207.12, 324/207.21; 307/309; 360/113; 338/32 R

[56] References Cited

U.S. PATENT DOCUMENTS 3,546,579 12/1970 Paul et al.
4,783,711 11/1988 Kitada et al.
4,954,216 9/1990 Hunter et al.
4,954,920 9/1990 Yamada et al.
5,021,909 6/1991 Shiiba .............................. 324/252 X
5,119,025 6/1992 Smith et al. ..................... 324/252

OTHER PUBLICATIONS

Gebhardt et al., "A Magnetoresistive Permalloy Magnetic Field Sensor" Experimentelle Technik der Physik 30 (1982) 4, pp. 363–367.

Primary Examiner—Gerard R. Strecker
Attorney, Agent, or Firm—William W. Holloway

[57] ABSTRACT

A thin film magnetometer includes first and second thin film magnetoresistive elements and first and second thin film laminated flux collectors. The first magnetoresistive element is located in a gap formed by the flux collectors, and the second magnetoresistive element is subtantially magnetically shielded by the flux collectors, and acts as a thermistor. The magnetoresistive elements are connected in a bridge circuit whereby any signal component due to thermal effects on the magnetoresistive elements is removed from the signal produced by the first magnetoresistive element.

1 Claim, 5 Drawing Sheets

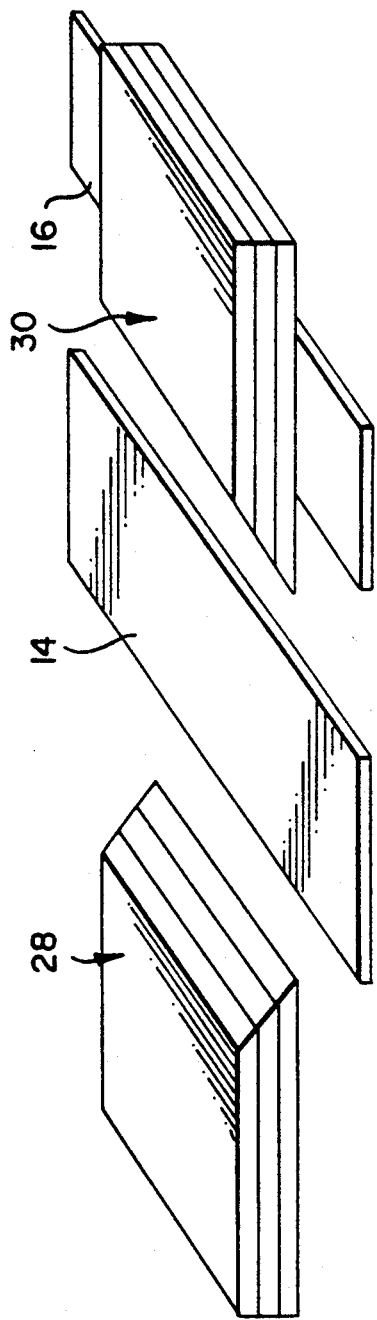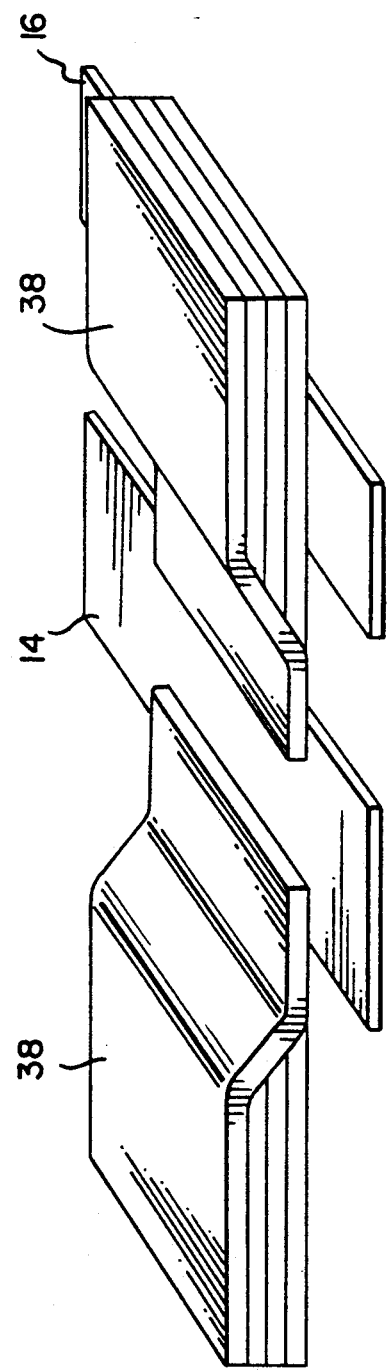

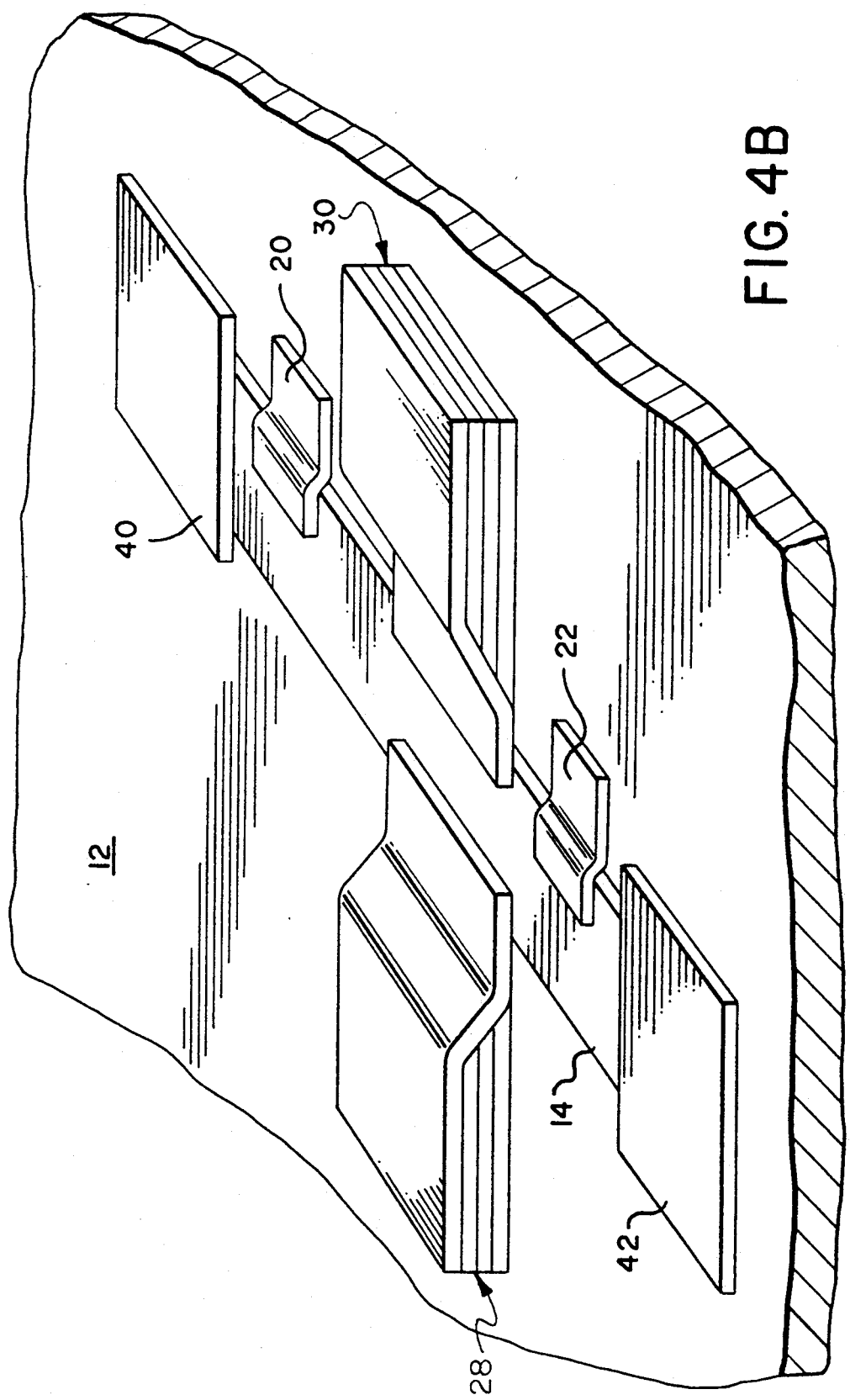

THIN FILM VERY HIGH SENSITIVITY MAGNETORESISTIVE MAGNETOMETER HAVING TEMPERATURE COMPENSATION AND SIMPLE DOMAIN STABILITY

FIELD OF THE INVENTION

Present invention relates to a sensor for measurement of magnetic fields, and in particular to a magnetic field sensor having a thin film magnetoresistive element and thin film laminated flux collectors.

BACKGROUND ART

A high sensitivity, small size, low-power consumption, broad bandwidth magnetometer having a thin film magnetoresistive (MR) element formed in a gap defined by a pair of thin film laminated flux collectors is disclosed in U.S. Ser. No. 737,755 filed Jul. 30, 1991 by N. Smith and F. Jeffers, now U.S. Pat. No. 5,119,025. Although this thin film sensor represented a marked improvement over prior art magnetometers, the design was found to suffer from several drawbacks: A nonzero temperature coefficient of resistivity for the NiFe MR film makes low frequency temperature fluctuations appear as unwanted noise signals. An external temperature sensitive resistor is generally used to help compensate for this unwanted noise signal, but such compensation cannot be complete because the thermal coupling between the resistor and the MR element is in practice inadequate. It is further difficult to control overlap of the relatively thick film flux collectors with the thin MR sensor and also difficult to etch the gap in the flux collectors without damaging the MR film. It has also been found that the magnetic state of the MR element may often be multidomain with accompanying domain walls. Such domain walls act as a source of hysteresis and Barkhausen noise when subjecting the magnetometer to sufficiently large magnetic fields.

SUMMARY OF THE INVENTION

It is therefore the object of the present invention to provide improvements in the thin film magnetometer that overcome the shortcomings noted above.

The object is achieved according to one aspect of the invention by providing a magnetoresistive magnetometer having first and second thin film magnetoresistive elements. First and second thin film laminated flux concentrators are formed over the first and second magnetoresistive elements to define a gap over the first magnetoresistive element. The magnetic influence of the flux collectors is such that the component of the sensed magnetic field that is in the direction across (perpendicular to) the gap, is, at the site of the first MR element in the gap, substantially magnified in strength, while the component of the sensed magnetic field along (parallel to) the gap is, at the same site, substantially reduced in strength. In contrast, both of these components of a sensed magnetic field will be substantially reduced by the flux collectors at the site of the second MR element. The first and second MR elements are connected in a bridge circuit, wherein the second MR element functions solely as a thermo resistor to cancel out thermal affects on the signal from the first magnetoresistive element. Since the first and second magnetoresistive elements are arranged in close proximity on a common substrate, they are subjected to substantially identical in-phase thermal disturbances, thereby more nearly completely eliminating thermal noise in the sensor.

According to another feature of the present invention, the bulk of the laminated flux collectors are formed and patterned to a thickness somewhat less than desired and having a gap spacing wider than the magnetoresistive element, while shielding the temperature compensating magnetoresistive element. Then, a final thickness of flux concentrator material is deposited and patterned over the magnetoresistive elements. The thinner, and thus more easily patterned and etched layer of flux collector in the vicinity of the gap allows (i) greater flux concentration at the collector-MR sensor overlap, (ii) greater control of the overlap width to better optimize (minimize) the reluctance of the MR-collector magnetic coupling, and (iii) removal of previous fabrication difficulties associated with increasing flux collector thickness. This latter advantage allows the thickness of the remaining bulk region of the collectors separate from the gap to be independently increased. This, in turn, improves magnetometer sensitivity because the amplification of the gap field by the flux collectors is in the present invention an increasing function of the bulk flux collector thickness, given a fixed thickness at the vicinity of the gap. Finally, the design of the magnetoresistive sensor is modified to provide means for controlling the magnetic state of the MR sensor in the end regions external to the flux concentrators in a manner such as to effectively guarantee a stable, single domain state in the active MR sensor region internal to the flux collector gap without unduly inhibiting magnetic sensitivity in this active region. In a preferred embodiment, this magnetic state function is provided by either a deposited permanent magnet film (e.g., CoPt) which may be separated from the MR layer by a thin spacer layer or by an exchange coupling layer (e.g. TbCo) deposited directly onto the MR film. In both cases, these extra layers preferably do not extend past the inside edge of the current lead contact areas. The purpose of the extra layers is to fix the magnetization in the outer, end regions of the MR film in order to provide a distinct, lower energy preference for one direction of longitudinal (easy-axis) magnetization in the inner, active region of the MR film. This should eliminate the tendency for the formation of multidomain magnetic states and associated Barkhausen noise producing domain walls. According to another embodiment, a similar function is provided by a set of coils which produce a magnetic field in one particular longitudinal direction, which field similarly influences the magnetic state of the end regions of the MR element.

BRIEF DESCRIPTION OF THE DRAWINGS

FIG. 1 is a schematic perspective view of a thin film magnetometer according to the present invention while

FIGS. 3A and 3B are schematic perspective views illustrating a preferred method of fabricating a magnetometer according to the present invention;

FIG. 4A is a schematic perspective view showing a magnetometer according to a first embodiment of the present invention, while FIG. 4B is a schematic perspective view showing a magnetometer according to a second embodiment of the present invention, including exchange coupled tabs for sweeping domain walls from the magnetoresistive elements.

MODES OF CARRYING OUT THE INVENTION

Figure 1:
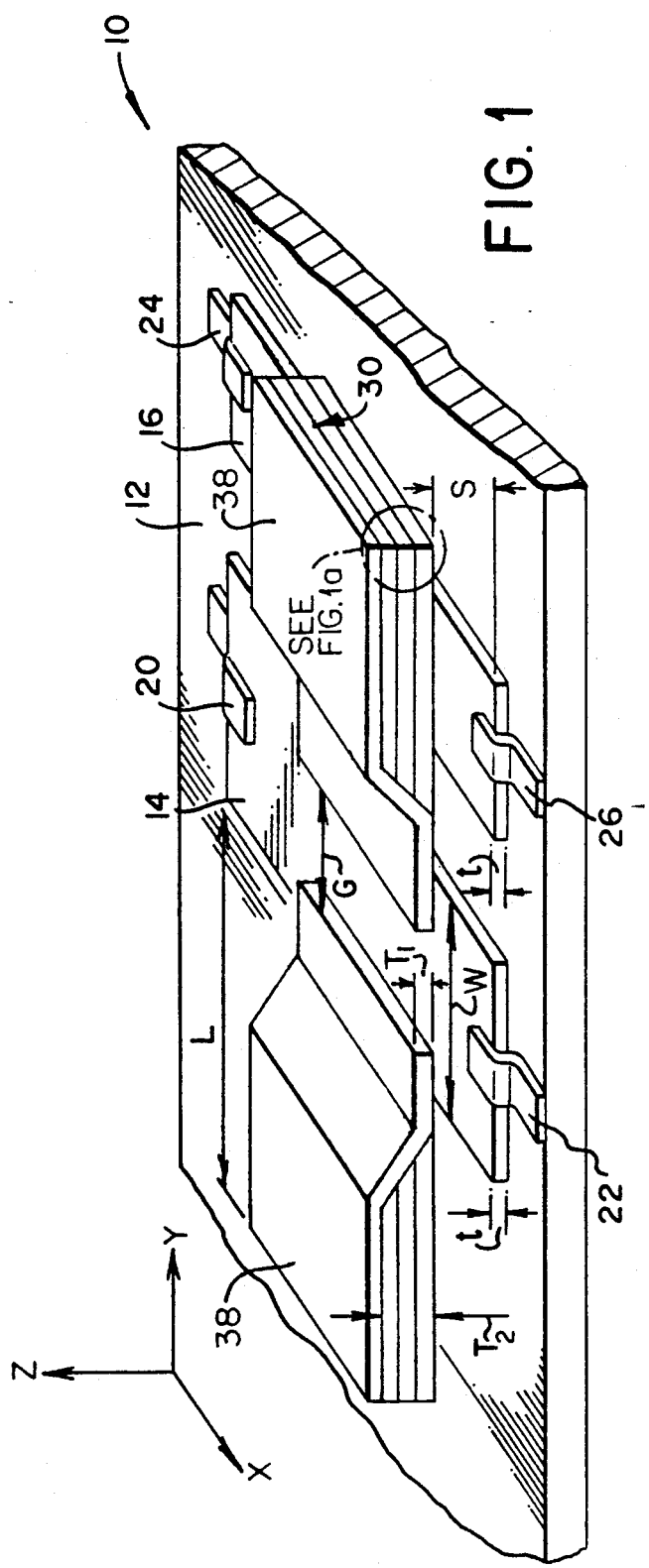
Figure 1A:
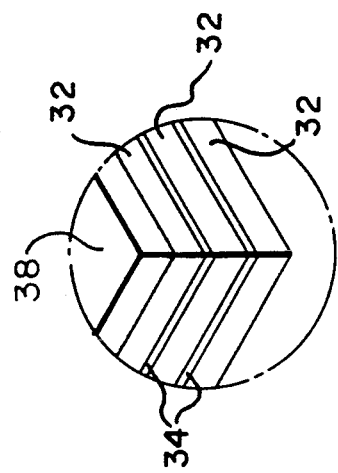
FIG. 1a is an expanded view of a flux collector of the thin film magnetometer.

Referring to FIG. 1, a magnetic field sensor 10 according to the present invention includes a substrate 12 upon which is deposited and patterned a pair of permalloy MR elements 14 and 16. Conductors 20 and 22 for conducting sense current through the MR element 14 and conductors 24 and 26 for conducting sense current through the MR element 16 are deposited in electrical contact with the respective MR elements. A thin layer of SiO$_2$ or similar insulation material (not shown) is deposited over the MR elements to electrically insulate the MR elements 14 and 16 from flux collectors 28 and 30, which are then deposited to within their desired thickness less about 1 micron. The flux collectors 28 and 30 are deposited and patterned such that they do not overlap the edges of MR element 14 and such that MR element 16 is totally overlapped by flux collector 30. Next, a final thin layer of highly permeable collector material 38 is deposited on the device and patterned to overlay MR element 14 by the desired amount. Magnetic flux is concentrated in MR element 14 by the flux collectors, and the flux collector over MR element 16 magnetically shields MR element 16 from external magnetic fields. As shown in detail in FIG. 1a, each flux collector 28 and 30 may comprise stacked 1 to 3 micron thick laminations 32 of highly permeable NiFe magnetic material separated by roughly 0.1 micron layers 34 of SiO$_2$.

The modulation in voltage drop across the MR element 14 due to the flow of sense current via conductors 20 and 22 is proportional to the resistance of the MR element 14 resulting from the strength of a magnetic field across element 14 concentrated by flux collectors 28 and 30, and also incidentally to the temperature of the MR element 14. A change in temperature of MR element 14 can cause a change in the resistance and hence an error in the signal representing the magnetic field in the region of the thin film magnetometer. To remove the portion of signal due to thermal effects, the signal produced by the MR element 16, which is magnetically shielded from external fields by flux collector 30, but which is closely thermally coupled to element 14, is subtracted from the signal produced by MR element 14 in a bridge circuit as shown in FIG. 2.

Figure 2:
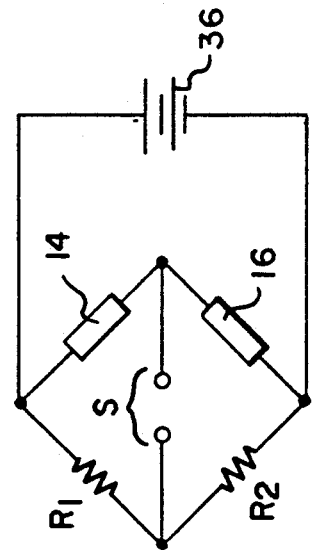
FIG. 2 is a circuit diagram showing the bridge circuit including the elements of the magnetometer of FIG. 1.

Referring to FIG. 2, MR element 14 is connected in one leg of the bridge circuit, MR element 16 in an adjacent leg, and resistors R1 and R2 in the other two legs of the circuit. Sensing voltage from a voltage source 36 is applied across the bridge, and a modulation in voltage drop S is generated representing the strength of the magnetic field free from any component caused by thermal effects. Since MR elements 14 and 16 are deposited in close proximity and at the same time on the common substrate 12, they are subjected to nearly identical thermal effects and have nearly identical thermal properties, thereby providing an improvement over the prior practice of providing an external thermistor in the bridge circuit.

In a presently preferred embodiment, the thickness t of the MR elements 14 and 16 is 150 angstroms; their length along the y-direction (defined in FIG. 1) is 16 microns. The thickness T$_1$ of those portions of each flux collector that overlap the MR element 14 is 1 micron; the length of each of these portions along the y-direction is 10 microns. The thickness T$_2$ of the bulk of the flux collectors is greater than or equal to 6 microns. The total length along the y-direction of each complete flux collector is 1 cm. The permeability $\mu$ of the MR elements and of the flux collectors is approximately 2000. The insulator spacing thickness s between MR element 14 and the overlapping flux collector is 0.5 microns. The optimal width for MR-flux collector overlap, given approximately by the expression $(\mu t s)^{\frac{1}{2}}$ is 4 microns. From the above, it follows that the collector gap-width G should be approximately 8 microns. The width (along x) of the flux collectors may vary between 0.1 and 1 cm, and the widths of MR elements 14 and 16 should preferably exceed the width of the flux collectors by at least twice the MR element height W.

Due to the relatively large thicknesses T$_2$ (6 microns) of the flux collectors 28 and 30 with respect to the overlap of 4 microns with the MR element 14, it has proven to be somewhat difficult to accurately manufacture a magnetometer with uniform thickness flux collectors as described in previous art. This problem is overcome as shown in FIGS. 3A and 3B as follows. First the MR elements 14 and 16 are deposited and patterned. An insulating layer of SiO$_2$ is deposited over the MR elements. Next, the flux collectors 28 and 30 are formed to within their desired total thickness less about 1 micron. The flux collectors are patterned such that they do not overlap the MR element 14, thereby relieving the necessity of insuring overlap by a precise amount. Next, a final thin layer (e.g. 1 micron) of highly permeable flux collector material 38 is deposited on the device and patterned to overlap the MR element 14 by the desired amount. The final thin layer 38 is much more easily patterned than the full stack of the flux collectors, thereby making the process easier to control such that the gap formed by the flux collector can be precisely patterned without attacking the MR element. Also, the thin layer improves the magnetic flux concentration at the MR element 14, thereby making the magnetometer more sensitive. With a suitable amplifier, the improved thin film magnetometer according to the present invention is capable of detecting low level magnetic fields of 10$^{-8}$Oe near DC with minimal thermal drift.

In addition to thermally induced noise which is compensated for as described above, another potential source of noise, known as Barkhausen noise, is caused by motion of, or state changes in, the magnetic domain walls associated with multidomain magnetic states within the MR sensor located interior to the current conductors shown as 20 and 22 on FIG. 1. Such multidomain states most commonly arise due to their lower magnetostatic energy in comparison to that of the single domain (i.e. wall-free) state. By fixing the magnetic state of the MR element end regions to quasi-permanently remain magnetized longitudinally (either along +x, or −x, but not both), the lowest energy state of the active sensor interior to the flux collectors can be arranged to be a wall-free state with longitudinal (easy-axis) component of magnetization everywhere the same as was fixed in the end regions. As described above, "end regions" refer in particular to the area of the MR element 14 external to the flux collectors but adjacent or interior to the edges of the current conductors 20 and 22.

Figure 4A:
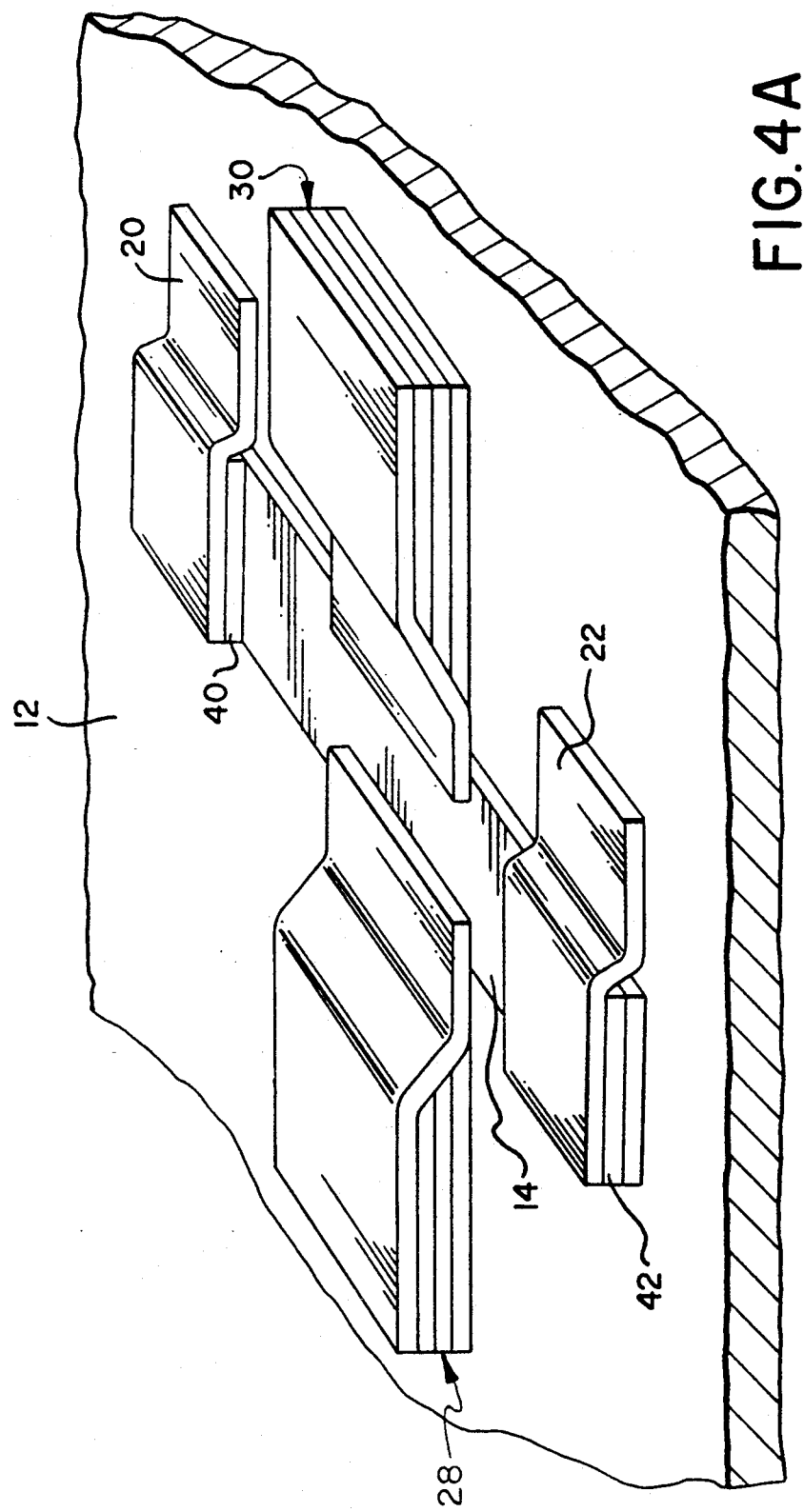

One way of achieving this is, as indicated in FIG. 4A, to deposit tabs 40 and 42 of antiferromagnetic (e.g. FeMn) or ferrimagnetic (e.g. TbCo) materials in intimate contact with the MR element while in the presence of an external magnetic field oriented longitudinally. This magnetic field then defines the direction along which the MR element magnetization will be "fixed" via the exchange interaction. A similar result can be achieved by depositing tabs 40 and 42 of a hard ferromagnetic (permanent magnet) material (e.g. CoPt), which may be separated from the MR element by an additional seed layer (e.g., Cr). The "fixing" mechanism in this case is the strong magnetostatic fields of the hard ferromagnetic tabs, and the preferential longitudinal direction for the MR element magnetization in the active interior would be that of the longitudinal permanent magnetization direction of the tabs. A third manner of achieving a similar result is indicated in FIG. 4B where tabs 40 and 42 are deposited adjacent to and to the exterior of conductors 20 and 22. In this third manner, the tabs can be comprised of antiferromagnetic or ferrimagnetic materials or permanent magnetic materials deposited and magnetized in one of the methods described above (a possible change in the order of deposition). The thickness of the tabs in the above methods may range from roughly 0.1 micron (exchange tabs) to roughly 1 micron (hard magnet tabs), with the interior tab edges not to extend beyond the interior edges of the current conductors 20 and 22.

Figure 5:
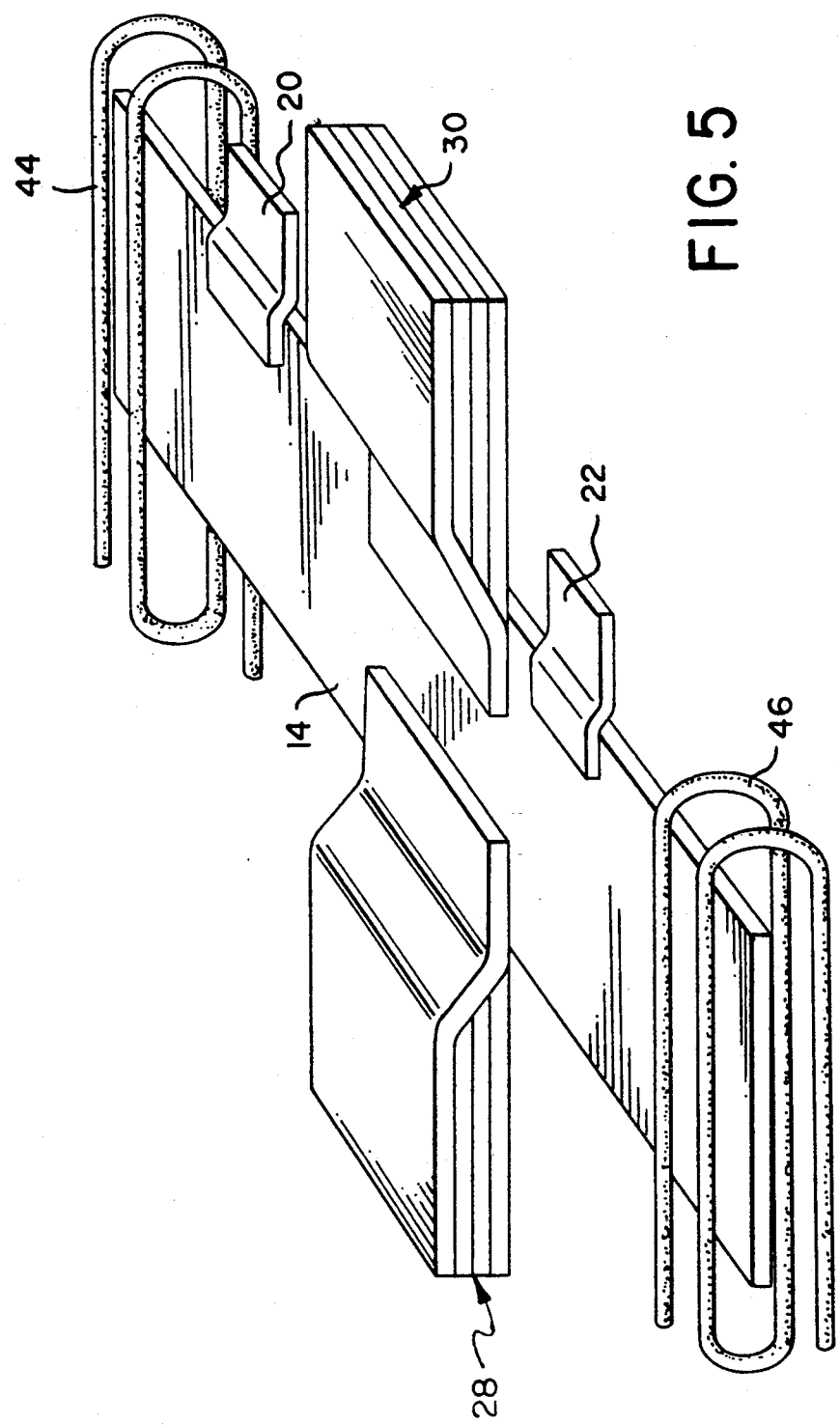
FIG. 5 is a schematic perspective view of a magnetometer according to the present invention, further including coils for applying a localized field in the direction of the easy axis of the magnetoresistive element.

Yet another alternative to the deposited tabs for controlling the end magnetication of the MR element is the application of a longitudinal applied magnetic field from a permanent magnet or dedicated coil (or thick conductive layer acting as a one-turn coil) through which a current is passed to generate the field. FIG. 5 shows an embodiment using coils 44 and 46 rather than a magnet or thick conductive layer. The magnet or coil should be capable of providing a longitudinal field in the order of 10 Oe or greater at the site of the end regions of the MR element exterior to the flux collectors. This field may be applied statically, or, in the case of the coil, only intermittently in order to "initialize" the MR element in a single domain wall-free state. Such intermittent application of the field may be achieved in conjunction with an ac demagnetization cycle produced by a second coil (e.g., the biasing coil described in the previous art) providing a transverse (along y) ac demagnetizing field.

Industrial Applicability and Advantages

The magnetometer according to the present invention is useful for measuring low intensity spatially uniform magnetic fields. It is advantageous in that is has improved sensitivity and signal-to-noise characteristics over that of the prior art and is easier to manufacture.

We claim:
1. A magnetoresistive magnetometer, comprising:
   a) first and second thin film magnetoresistive elements deposited side-by-side on a substrate and each forming a portion of a circuit capable of detecting changes in resistance across each of said magnetoresistive elements;
   b) first and second thin film laminated flux concentrators disposed over said magnetoresistive elements said first and second flux concentrators being arranged: 1) to define a gap over said first magnetoresistive element such that a component of a magnetic field in the vicinity of the magnetometer in a direction across the gap is magnified and a component of the magnetic field along the gap is reduced, and 2) to substantially magnetically shield said second magnetoresistive element from external magnetic fields; and
   c) bridge circuit means connected to said first and second magnetoresistive elements wherein thermally induced signals from said first and second elements are cancelled.

* * * * *

UNITED STATES PATENT AND TRADEMARK OFFICE
CERTIFICATE OF CORRECTION

PATENT NO. : 5,260,653

DATED : November 9, 1993

INVENTOR(S) : Neil Smith, Jay D. Freeman, Frederick J. Jeffers

It is certified that error appears in the above-identified patent and that said Letters Patent is hereby corrected as shown below:

On the title page, in item [54], and in column 1, line 5:

In the title delete "SIMPLE" and insert --SINGLE--.

Signed and Sealed this

Thirty-first Day of May, 1994

*Attest:*

BRUCE LEHMAN

*Attesting Officer*  *Commissioner of Patents and Trademarks*